(12) United States Patent
Derderian

(10) Patent No.: US 7,518,223 B2
(45) Date of Patent: Apr. 14, 2009

(54) SEMICONDUCTOR DEVICES AND SEMICONDUCTOR DEVICE ASSEMBLIES INCLUDING A NONCONFLUENT SPACER LAYER

(75) Inventor: James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 09/939,253

(22) Filed: Aug. 24, 2001

(65) Prior Publication Data

US 2003/0038355 A1    Feb. 27, 2003

(51) Int. Cl.
*H01L 25/065* (2006.01)
*H01L 23/02* (2006.01)

(52) U.S. Cl. ............ 257/686; 257/E23.052; 257/E25.013; 257/E21.705; 257/685; 257/777; 257/723; 257/784; 257/786; 257/787; 257/734; 257/737; 257/728; 257/778; 257/730; 257/773

(58) Field of Classification Search ............... 257/686, 257/685, 777, 778, 774, 775, 784–787, 730, 257/734, 737, 738, 723, 773, E23.052, E23.013, 257/E21.705
See application file for complete search history.

(56) References Cited

U.S. PATENT DOCUMENTS

| 3,811,186 | A |   | 5/1974  | Larnerd et al.         |
|-----------|---|---|---------|------------------------|
| 4,184,043 | A |   | 1/1980  | Hildering              |
| 5,037,779 | A |   | 8/1991  | Whalley et al.         |
| 5,056,215 | A |   | 10/1991 | Blanton                |
| 5,220,200 | A | * | 6/1993  | Blanton ......... 257/778 |
| 5,251,806 | A |   | 10/1993 | Agarwala et al.        |
| 5,296,738 | A |   | 3/1994  | Freyman et al.         |
| 5,323,060 | A |   | 6/1994  | Fogal et al. ..... 257/777 |
| 5,331,235 | A |   | 7/1994  | Chun                   |
| 5,536,362 | A |   | 7/1996  | Love et al.            |
| 5,684,677 | A |   | 11/1997 | Uchida et al.          |
| 5,880,017 | A |   | 3/1999  | Schwiebert et al.      |
| 5,892,417 | A |   | 4/1999  | Johnson et al.         |
| 5,934,545 | A |   | 8/1999  | Gordon                 |
| 6,005,778 | A |   | 12/1999 | Spielberger et al.     |
| 6,023,217 | A |   | 2/2000  | Yamada et al.          |
| RE36,613  | E |   | 3/2000  | Ball ............ 257/777 |
| 6,049,370 | A | * | 4/2000  | Smith et al. ..... 349/156 |
| 6,051,886 | A |   | 4/2000  | Fogal et al. ..... 257/777 |

(Continued)

FOREIGN PATENT DOCUMENTS

JP    401185952    7/1989

(Continued)

*Primary Examiner*—Alexander O Williams
(74) *Attorney, Agent, or Firm*—TraskBritt

(57) ABSTRACT

A semiconductor device that includes at least one nonconfluent spacer layer on at least one surface thereof. The at least one nonconfluent spacer layer at least partially spaces the surface of the semiconductor device apart from another semiconductor device assembled in stacked arrangement therewith. Adjacent stacked semiconductor devices may include abutting nonconfluent spacer layers which together define a distance between opposed surfaces of the semiconductor devices. Each nonconfluent spacer layer includes voids therein that communicate with an exterior periphery of the layer to facilitate the lateral introduction of adhesive or encapsulant material into the layer and between the adjacent, stacked semiconductor devices. Multi-chip modules are also disclosed, as are methods for forming the nonconfluent spacer layers and assembly and packaging methods.

43 Claims, 4 Drawing Sheets

U.S. PATENT DOCUMENTS

| | | | |
|---|---|---|---|
| 6,063,688 A | 5/2000 | Doyle et al. | |
| 6,071,371 A | 6/2000 | Leonard et al. | |
| 6,077,380 A * | 6/2000 | Hayes et al. | 257/778 |
| 6,080,264 A | 6/2000 | Ball | |
| 6,097,097 A | 8/2000 | Hirose | |
| 6,098,278 A * | 8/2000 | Vindasius et al. | 29/830 |
| 6,130,148 A * | 10/2000 | Farnworth et al. | 438/613 |
| 6,212,767 B1 | 4/2001 | Tandy | 257/686 |
| 6,287,895 B1 | 9/2001 | Sato | |
| 6,313,528 B1 | 11/2001 | Solberg | |
| 6,316,289 B1 | 11/2001 | Chung | |
| 6,316,786 B1 * | 11/2001 | Mueller et al. | 257/40 |
| 6,333,562 B1 * | 12/2001 | Lin | 257/777 |
| 6,340,846 B1 * | 1/2002 | Lobianco et al. | 257/777 |
| 6,351,028 B1 * | 2/2002 | Akram | 257/686 |
| 6,410,366 B1 | 6/2002 | Hashimoto | |
| 6,414,384 B1 * | 7/2002 | Lo et al. | 257/685 |
| 6,424,033 B1 * | 7/2002 | Akram | 257/718 |
| 6,437,449 B1 * | 8/2002 | Foster | 257/777 |
| 6,472,758 B1 * | 10/2002 | Glenn et al. | 257/777 |
| 6,521,480 B1 | 2/2003 | Mitchell et al. | |
| 6,531,784 B1 * | 3/2003 | Shim et al. | 257/777 |
| 6,534,345 B1 | 3/2003 | Muff et al. | |
| 6,534,391 B1 | 3/2003 | Huemoeller et al. | |
| 6,537,852 B2 * | 3/2003 | Cohn et al. | 438/109 |
| 6,552,416 B1 * | 4/2003 | Foster | 257/666 |
| 6,593,662 B1 | 7/2003 | Pu et al. | |
| 6,630,365 B2 | 10/2003 | Farnworth et al. | |
| 6,630,730 B2 | 10/2003 | Grigg | |
| 6,657,290 B2 * | 12/2003 | Fukui et al. | 257/686 |
| 6,682,954 B1 | 1/2004 | Ma et al. | |
| 6,724,084 B1 | 4/2004 | Hikita et al. | |
| 6,746,894 B2 | 6/2004 | Fee et al. | |
| 6,930,396 B2 * | 8/2005 | Kurita et al. | 257/777 |
| 2001/0002066 A1 | 5/2001 | Mita et al. | |
| 2001/0013643 A1 | 8/2001 | Nakanish et al. | |
| 2001/0035587 A1 * | 11/2001 | Kondo et al. | 257/777 |
| 2002/0005491 A1 * | 1/2002 | Yago et al. | 250/396 |
| 2002/0027630 A1 | 3/2002 | Yamada et al. | |
| 2002/0036345 A1 * | 3/2002 | Iseki et al. | 257/734 |
| 2002/0056899 A1 | 5/2002 | Hikita et al. | |
| 2002/0068417 A1 * | 6/2002 | Farnworth et al. | 438/455 |
| 2002/0070463 A1 * | 6/2002 | Chang et al. | 257/780 |
| 2002/0079567 A1 * | 6/2002 | Lo et al. | 257/685 |
| 2002/0151164 A1 * | 10/2002 | Jiang et al. | 438/613 |
| 2002/0167075 A1 * | 11/2002 | Madrid | 257/666 |
| 2002/0177250 A1 * | 11/2002 | Zhu et al. | 438/42 |
| 2002/0185746 A1 * | 12/2002 | Park | 257/778 |
| 2002/0195697 A1 | 12/2002 | Mess et al. | |
| 2003/0013643 A1 * | 1/2003 | Wessels et al. | 514/8 |
| 2003/0015803 A1 * | 1/2003 | Prietzch | 257/777 |
| 2003/0032217 A1 * | 2/2003 | Farnworth et al. | 438/108 |
| 2003/0038356 A1 * | 2/2003 | Derderian | 257/686 |
| 2003/0038374 A1 * | 2/2003 | Shim et al. | 257/777 |
| 2003/0042615 A1 * | 3/2003 | Jiang et al. | 257/777 |
| 2003/0178710 A1 * | 9/2003 | Kang et al. | 257/673 |
| 2003/0189259 A1 * | 10/2003 | Kurita et al. | 257/777 |
| 2004/0222509 A1 * | 11/2004 | Ogata | 257/686 |
| 2005/0077605 A1 * | 4/2005 | Yu et al. | 257/678 |
| 2005/0104183 A1 * | 5/2005 | Kuroda et al. | 257/686 |
| 2005/0224959 A1 * | 10/2005 | Kwon et al. | 257/723 |

FOREIGN PATENT DOCUMENTS

| | | | |
|---|---|---|---|
| JP | 06-021328 | * | 1/1994 |
| JP | 8-65579 | * | 3/1996 |
| JP | 08-288455 | * | 11/1996 |
| JP | 2001056648 A | | 8/1999 |
| JP | 2000-101016 | * | 4/2000 |

* cited by examiner

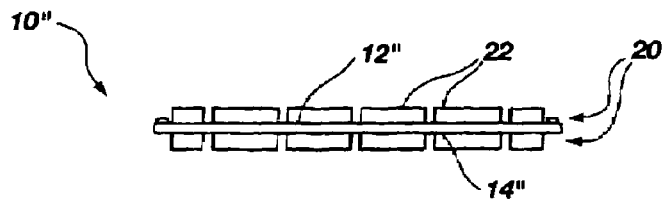
Fig. 4
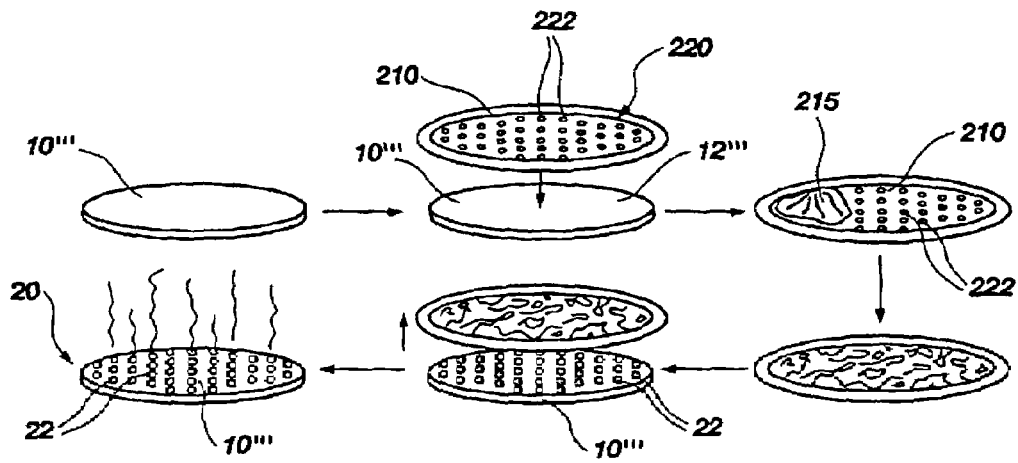
Fig. 5
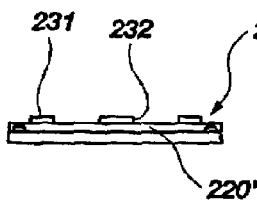 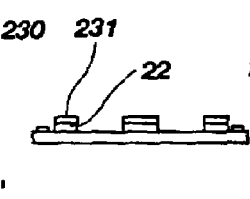 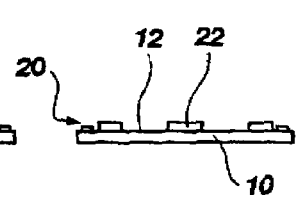
Fig. 6A  Fig. 6B  Fig. 6C  Fig. 6D
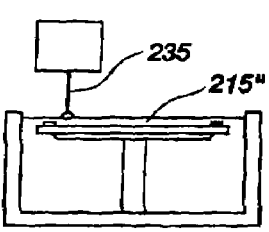 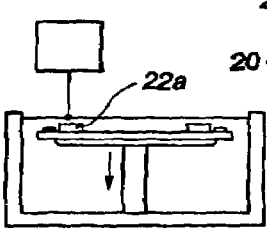 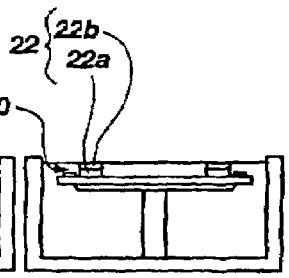
Fig. 7A  Fig. 7B  Fig. 7C  Fig. 7D

SEMICONDUCTOR DEVICES AND SEMICONDUCTOR DEVICE ASSEMBLIES INCLUDING A NONCONFLUENT SPACER LAYER

BACKGROUND OF THE INVENTION

1. Field of the Invention

The present invention relates generally to multi-chip modules and, more specifically, to multi-chip modules that include semiconductor devices in stacked arrangement. In particular, the present invention relates to multi-chip modules that include at least one semiconductor device with a spacer predisposed on a surface thereof and another semiconductor device in stacked relation thereto and spaced vertically apart therefrom by way of the predisposed spacer. More particularly, the predisposed spacer may be printed onto a surface of the at least one semiconductor device.

2. Background of Related Art

In order to conserve the amount of surface area, or "real estate," consumed on a carrier substrate, such as a circuit board, by semiconductor devices connected thereto, various types of increased-density packages have been developed. Among these various types of packages is the so-called "multi-chip module" (MCM). Some types of multi-chip modules include assemblies of semiconductor devices that are stacked one on top of another. The amount of space on a carrier substrate that may be saved by stacking semiconductor devices is readily apparent—a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), the incorporation of different types of functionality into a single semiconductor device has proven very difficult to actually reduce to practice. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated and assembled with one another much more quickly and cost-effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate, and a second, smaller semiconductor device positioned over and secured to the first semiconductor device. The second semiconductor device does not overlie bond pads of the first semiconductor device and, thus, the second semiconductor device does not cover bond wires that electrically connect bond pads of the first semiconductor device to corresponding contacts or terminals of the carrier substrate. Accordingly, the vertical spacing between adjacent semiconductor devices and, thus, the thickness of the adhesive layer are not critical. Such a multi-chip module is disclosed and illustrated in U.S. Pat. No. 6,212,767, issued to Tandy on Apr. 10, 2001 (hereinafter "the '767 Patent"). As the sizes of the semiconductor devices of such a multi-chip module must continue to decrease as they are positioned increasingly higher on the stack, the obtainable heights of such multi-chip modules become severely limited.

Another example of a conventional multi-chip module is described in U.S. Pat. No. 5,323,060, issued to Fogal et al. on Jun. 21, 1994 (hereinafter "the '060 Patent"). The multi-chip module of the '060 patent includes a carrier substrate with semiconductor devices disposed thereon in a stacked arrangement. The individual semiconductor devices of each multi-chip module may be the same size or different sizes, with upper semiconductor devices being either smaller or larger than underlying semiconductor devices. Adjacent semiconductor devices of each of the multi-chip modules disclosed in the '060 Patent are secured to one another with an adhesive layer, such as preformed, thermoplastic tape. The thickness of each adhesive layer exceeds the loop heights of wire bonds protruding from a semiconductor device upon which that adhesive layer is to be positioned. Accordingly, the presence of each adhesive layer prevents the back side of an overlying, upper semiconductor device from contacting bond wires that protrude from an immediately underlying, lower semiconductor device of the multi-chip module. The adhesive layers of the multi-chip modules disclosed in the '060 Patent do not encapsulate or otherwise cover any portion of the bond wires that protrude from any of the lower semiconductor devices.

A similar but more compact multi-chip module is disclosed in U.S. Pat. Re. 36,613, issued to Ball on Mar. 14, 2000 (hereinafter "the '613 Patent"). The multi-chip module of the '613 Patent includes many of the same features as those disclosed in the '060 Patent, including adhesive layers that space adjacent semiconductor devices apart a greater distance than the loop heights of wire bonds protruding from the lower of the adjacent dice. The use of thinner bond wires with low loop profile wire bonding techniques permits adjacent semiconductor devices of the multi-chip module disclosed in the '060 Patent to be positioned more closely to one another than adjacent semiconductor devices of the multi-chip modules disclosed in the '060 Patent. Nonetheless, additional space remains between the tops of the bond wires protruding from one semiconductor device and the back side of the next higher semiconductor device of such a multi-chip module.

Conventionally, stacked multi-chip modules that include semiconductor devices that overlie bond pads of the next, underlying semiconductor device include spacers, which may be formed from dielectric-coated silicon or polyimide film, to space the adjacent semiconductor devices apart from one another a sufficient distance to prevent bond wires protruding above the lower semiconductor device from contacting the back side of the upper semiconductor device. An adhesive material typically secures such a spacer between the adjacent semiconductor devices. When such spacers are used in the fabrication of multi-chip modules, each spacer must be properly aligned with and placed upon an active surface of the semiconductor device over which the spacer is to be positioned. These additional assembly processes may be somewhat undesirable for various reasons. For example, positioning of a spacer between each pair of adjacent semiconductor devices adds to assembly time. Further, additional steps in the assembly process increase the risk that semiconductor devices or discrete conductive elements may be damaged. In addition, the use of preformed spacers may undesirably add to the cost of a multi-chip module.

The vertical distance that adjacent semiconductor devices of a stacked type multi-chip module are spaced apart from one another may be reduced by arranging the immediately underlying semiconductor devices such that upper semiconductor devices are not positioned over bond pads of immediately underlying semiconductor devices or bond wires protruding therefrom. The vertical spacing of adjacent semiconductor devices in such an assembly is not critical and may be a distance that is less than the loop heights of the wire bonds that protrude above the active surface of the lower semiconductor device. U.S. Pat. No. 6,051,886, issued to Fogal et al. on Apr. 18, 2000 (hereinafter "the '886 Patent") discloses such a multi-chip module. According to the '886 Patent, wire bonding is not conducted until all of the semiconductor devices of such a multi-chip module have been assembled with one another and with the underlying carrier substrate. The semiconductor devices of the multi-chip modules disclosed in the '886 Patent must include bond pads that are arranged on opposite peripheral edges. Semiconductor devices with bond pads positioned adjacent the entire peripheries thereof could not be used in the multi-chip modules of the '886 Patent. This is a particularly undesirable limitation due to the ever-increasing feature density of state-of-the-art semiconductor devices, which is often accompanied by a consequent need for an ever-increasing number of bond pads on semiconductor devices.

In view of the foregoing, it appears that semiconductor devices including stacking spacers formed directly on at least one side thereof would be useful, as would methods for forming such assemblies.

SUMMARY OF THE INVENTION

The present invention includes a semiconductor device for use in a stacked assembly of semiconductor devices. As used herein, the term "semiconductor device" includes, but is not limited to, semiconductor dice, as well as full or partial wafers or other semiconductor substrates that include pluralities of semiconductor devices fabricated thereon. The semiconductor device includes at least one spacer layer that has been disposed on portions of a surface thereof to facilitate stacking of the semiconductor device with other semiconductor devices. A spacer layer may be disposed on a single surface of the semiconductor device or on both surfaces thereof.

A spacer layer incorporating teachings of the present invention may include a plurality of laterally discrete spacers, a somewhat contiguous layer with voids formed therein that communicate with an exterior periphery of the spacer layer, or any other nonconfluent configuration that facilitates the lateral flow of adhesive material through the spacer layer and between the adjacent semiconductor devices separated thereby. As used herein, the term "nonconfluent" applies to layers that include voids therein, such as, for example only, layers that include laterally discrete members, as well as layers that include internalized or externally communicating voids that extend completely or partially therethrough and layers that are not otherwise completely solid throughout the entire lateral surface areas thereof.

By way of example only, each spacer layer may be formed from a dielectric material. Dielectric materials such as polymers (e.g., epoxies, polyimides, or the like) may be used to form each spacer layer. The polymer may be a fully or partially cured or hardened thermoset resin, a UV-curable material, a thermoplastic resin, a silicone, a silicone-carbon resin, a polyimide, a polyurethane, a parylene, or the like. When a polymer is used, a spacer layer may be formed on a surface of a semiconductor device by screen printing, jet printing, needle dispensing, or other suitable processes. Curing of or otherwise hardening the polymer may then be effected by suitable processes, depending upon the type of polymer employed. Alternatively, each spacer layer may comprise a preformed layer that is adhered to a surface of the semiconductor device.

As an alternative, dielectric materials that are typically employed in semiconductor device fabricating processes, such as glass, undoped silicon oxides, silicon nitrides, and silicon oxynitrides, may be used to form the spacer layer. In the event that such materials are used, a material layer may be formed by suitable processes (e.g., spin-on glass (SOG), chemical vapor deposition (CVD) processes, etc.) then patterned (e.g., by mask and etch processes) to remove material at selected regions of the layer.

If a spacer layer is formed from a conductive or semiconductive material, the spacer layer may be fabricated by deposition (e.g., CVD, physical vapor deposition (PVD) (e.g., sputtering), etc.) and patterning processes that are suitable for the particular material used. A spacer layer that is formed from conductive or semiconductive material is preferably electrically isolated from structures that are located or will be positioned adjacent thereto, such as the active surface or back side of a semiconductor device. By way of example, the protective glass layer that is typically formed on the active surfaces of semiconductor devices may serve to electrically isolate the active surface of a semiconductor device from a spacer layer that includes conductive or semiconductive material. As another example, a conductive or semiconductive spacer layer may be coated with a dielectric material, such as an electrically nonconductive oxide of the conductive or semiconductive material from which the spacer layer is formed. The back side or active surface of an adjacent semiconductor device may be electrically isolated from a conductive or semiconductive spacer layer by way of a dielectric coating thereon. Such a dielectric coating may be substantially confluent or may cover only portions of the back side that are to be located adjacent to the conductive or semiconductive material of the spacer layer.

Each spacer layer may have a thickness that will, either alone or in combination with the thickness of another, adjacent spacer layer of another semiconductor device, prevent portions of discrete conductive elements that protrude above a surface of one or both of the adjacent semiconductor devices from contacting the other of the adjacent semiconductor devices.

Formation or disposal of the spacer layer may be effected on either individual semiconductor devices, simultaneously on groups of individual semiconductor devices, or on semiconductor devices that have yet to be singulated from a large-scale substrate, such as a wafer or portion thereof.

The spacer layer is preferably disposed on the semiconductor device prior to assembly thereof with other components. Thus, semiconductor devices on which spacer layers have been formed or disposed may be tested prior to assembly or packaging thereof with other components. The effects of forming or disposing the spacer layer on the operability or reliability of a semiconductor device may, therefore, be evaluated prior to assembly or packaging of the semiconductor device with other components. Consequently, semiconductor devices that are damaged or rendered inoperable by formation or disposal of the spacer layer thereon may be discovered and discarded prior to assembly or packaging thereof.

A stacked assembly incorporating teachings of the present invention includes a first semiconductor device, a second semiconductor device, a spacer layer between the first and second semiconductor devices, and discrete conductive elements that are connected to bond pads of and protrude from a surface of one of the semiconductor devices.

The spacer layer may secure the first and second semiconductor devices to one another. By way of example, an adhesive material may be applied to all or part of an exposed surface of the spacer layer prior to assembling the first and second semiconductor devices with each other. Alternatively, the spacer layer may comprise an uncured or partially cured material that may be adhered to an adjacent spacer layer or a surface of a semiconductor device upon contacting the same or upon at least partially curing the material of the spacer layer, securing the first and second semiconductor devices to one another.

Of course, such an assembly may include more than two semiconductor devices in stacked arrangement with one another.

One of the semiconductor devices of a stacked assembly may be secured to or otherwise associated with a substrate. Exemplary substrates include, but are not limited to, circuit boards, interposers, other semiconductor devices, and leads. Discrete conductive elements, such as bond wires, tape-automated bond (TAB) elements comprising conductive traces on a dielectric film, leads, or the like, may electrically connect bond pads of one or more of the semiconductor devices of such a stacked assembly to corresponding contact areas of a substrate.

An assembly incorporating teachings of the present invention may be part of a package and, thus, include a protective encapsulant covering at least portions of the semiconductor devices, the discrete conductive elements, and regions of a substrate that are located adjacent to at least one of the semiconductor devices. Such a package may also include external connective elements that communicate with corresponding contact areas of the substrate and/or bond pads of one or more of the stacked semiconductor devices.

In another aspect of the present invention, a spacer layer incorporating teachings of the present invention may be designed by configuring regions that each have a thickness that will, either alone or in combination with an adjacent spacer layer, separate two semiconductor devices apart from one another a set distance. By way of example only, the set distance may be sufficient to prevent discrete conductive elements protruding above the surface of one or both of the semiconductor devices and located between the semiconductor devices from contacting a surface of the other adjacent semiconductor device. Alternatively, the discrete conductive elements protruding above a surface of one of the adjacent, stacked semiconductor devices may contact a surface of the other, adjacent semiconductor device if at least contacting portions of either or both of the discrete conductive elements and semiconductor device surfaces are electrically isolated from one another. A method for designing a spacer layer in accordance with the present invention may also include configuring solid regions and voids that will facilitate the flow of an underfill or encapsulant material therethrough while reducing or eliminating the incidence of voids in the underfill or encapsulant material.

The present invention also includes methods for forming spacer layers, methods for forming semiconductor devices that include the spacer layers, methods for assembling such a semiconductor device with one or more other semiconductor devices, and methods for packaging such assemblies.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which illustrate exemplary embodiments of various aspects of the present invention:

FIG. 4 is a side view that depicts a semiconductor device with spacer layers on both an active surface and a back side thereof;

FIG. 5 schematically depicts the use of screen printing techniques to form the spacers of a spacer layer on a semiconductor device;

FIGS. 6A-6D are schematic representations of the use of semiconductor device fabrication processes to form the spacers of a spacer layer on a semiconductor device;

FIGS. 7A-7D schematically illustrate formation of the spacers of a spacer layer on a semiconductor device by way of stereolithography;

DETAILED DESCRIPTION

Figure 1:
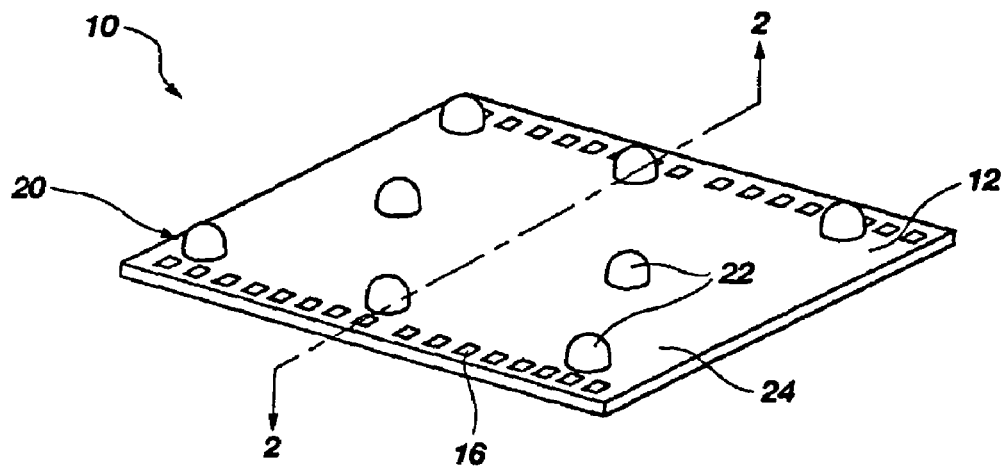
FIG. 1 is a perspective view of an exemplary embodiment of a semiconductor device incorporating teachings of the present invention, which semiconductor device includes a spacer layer on an active surface thereof.
Figure 2:
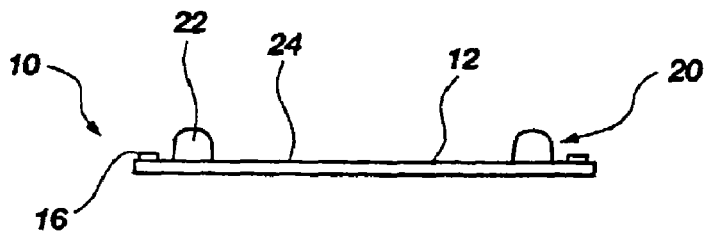
FIG. 2 is a cross-section taken along line 2-2 of FIG. 1.

With reference to FIGS. 1 and 2, an exemplary embodiment of a semiconductor device 10 is illustrated. Semiconductor device 10 includes a spacer layer 20 on an active surface 12 thereof.

Spacer layer 20 is positioned on active surface 12 or configured such that bond pads 16 of semiconductor device 10 are exposed beyond an outer periphery of spacer layer 20 or are otherwise accessible to equipment for forming or positioning discrete conductive elements (e.g., a wire bonding capillary, thermocompression bonding equipment, etc.).

As depicted, spacer layer 20 includes a plurality of discrete, laterally spaced apart solid regions, which are referred to herein as spacers 22, and voids 24 that are located between adjacent spacers 22. Although spacers 22 are depicted in FIGS. 1 and 2 as being laterally offset from bond pads 16, if formed following the connection of discrete conductive elements 18 (see, e.g., FIG. 10) to bond pads 16, any suitable embodiment of spacer 22 incorporating teachings of the present invention may be formed over bond pads 16, as well as the portions of discrete conductive elements 18 that are proximate thereto. Due to the presence of voids 24 in spacer layer 20, spacer layer 20 covers only portions of active surface 12. Voids 24 are configured and arranged to receive an underfill or encapsulant material, which may, at least in part, secure semiconductor device 10 to another at least partially superimposed semiconductor device 110 (FIG. 9). Other nonconfluent configurations of spacer layers that are configured to permit an adhesive material to flow laterally thereinto and thereby substantially fill voids in the spacer layer are also within the scope of the present invention.

Spacers 22 and voids 24 of spacer layer 20 may be arranged randomly or in a pattern. The configurations of spacers 22 and voids 24 may facilitate the introduction of an underfill or encapsulant material into voids 24 while reducing or eliminating the incidence of void or bubble formation in the underfill or encapsulant material.

Spacers 22 may be substantially identically configured or have different configurations. By way of example only, spacers 22 may have substantially planar upper surfaces and cross-sectional shapes taken along the length thereof including, but not limited to, round shapes (e.g., circular, ovals, ellipsoids, etc.), polygonal shapes (e.g., triangular, square, diamond-shaped, rectangular, hexagonal, octagonal, etc.) (see FIG. 4), crosses, elongate members which may be straight, bent, or curved, and other shapes. Alternatively, the upper surfaces of spacers 22 may be nonplanar, such as cones, pyramids, the depicted domes, or other suitable shapes. Spacers 22 may comprise solid or at least partially hollow members.

Figure 3:
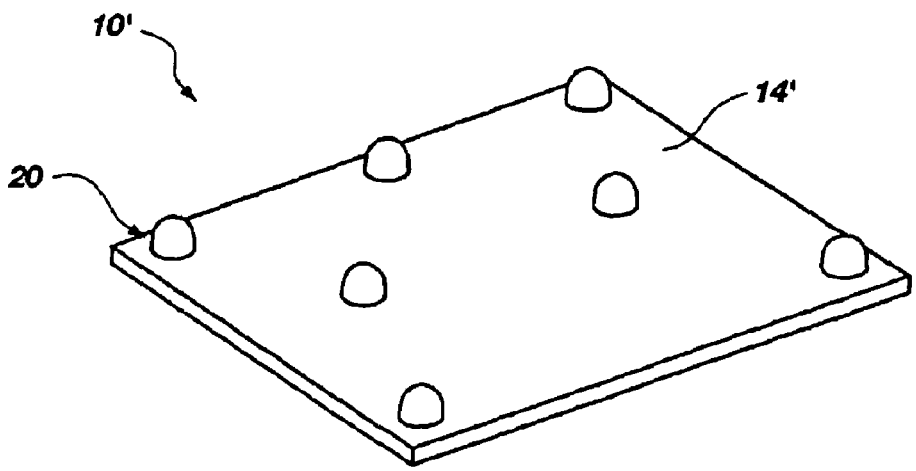
FIG. 3 is a perspective view illustrating another, inverted semiconductor device according to the present invention, which includes a spacer layer on a back side thereof.

FIG. 3 illustrates another embodiment of semiconductor device 10', which includes a spacer layer 20 on a back side 14' thereof. Spacer layer 20 may include any combination of features described above with reference to FIGS. 1 and 2.

Another embodiment of semiconductor device 10" is shown in FIG. 4. Semiconductor device 10" includes spacer layers 20 on both an active surface 12" and a back side 14" thereof.

FIGS. 5-8 illustrate exemplary methods by which spacer layers 20 and their spacers 22 may be fabricated.

FIG. 5 schematically depicts the use of a screen printing process in which a spacer layer 20 is formed on a semiconductor device 10''', shown in the form of a wafer including a plurality of devices fabricated thereon. A screen 210 of a known type with a spacer pattern 220 therein is positioned over and aligned with semiconductor device 10'''. Spacer pattern 220 includes apertures 222 through which regions of an active surface 12''' of semiconductor device 10''' are exposed. A quantity of a suitable spacer material 215 is then placed on screen 210 and spread thereacross, causing some of spacer material 215 to fill apertures 222 and adhere to active surface 12'''. Screen 210 may then be removed from semiconductor device 10''', with spacer material 215 that remains on active surface 12''' forming spacers 22 of spacer layer 20. The material of spacers 22 may be cured or otherwise hardened by a process (e.g., thermally, by irradiation, by cooling, etc.) or combination of processes that is suitable for the particular type of spacer material 215 employed.

A method in which conventional semiconductor device fabrication processes are used to form spacers 22 of spacer layer 20 is illustrated in FIGS. 6A-6D. In FIG. 6A, a layer 220' of a material suitable for use as spacers 22 (FIG. 6D) is formed over an active surface 12 of a semiconductor device 10. Known processes (e.g., spreading, exposure, and developing of a photoimageable polymer) may then be used to form a mask 230 over layer 220'. Solid regions 231 of mask 230 cover portions of layer 220' that will subsequently form spacers 22 of spacer layer 20 (FIG. 6D), while other regions of layer 220', which are to be removed, are exposed through apertures 232 of mask 230. Semiconductor device 10 and mask 230 may then be exposed to an etchant that will remove the material of layer 220' in regions thereof that are exposed through apertures 232, as depicted in FIG. 6C. Upon removing the desired portions of layer 220', spacers 22 of spacer layer 20 are formed. Mask 230 may be removed from spacer layer 20 by known processes (e.g., use of a suitable resist strip when mask 230 comprises a photomask).

FIGS. 7A-7D schematically depict an exemplary stereolithography process for fabricating spacer layer 20 (FIG. 7D) on an active surface 12 of a semiconductor device 10. As shown in FIG. 7A, active surface 12 of semiconductor device 10 may be submerged beneath a quantity of unconsolidated material 213" (e.g., a liquid photoimageable polymer), which forms a layer 215" over active surface 12. In FIG. 7B, selected regions of layer 215" are at least partially consolidated, as known in the art (e.g., by exposure of a liquid photoimageable polymer to curing radiation, such as a laser beam 235). The at least partially consolidated portions of layer 215" form sublayers 22a of spacers 22 of spacer layer 20 (FIG. 7D). This process may be repeated, as shown in FIGS. 7C and 7D, one or more times to form a plurality of at least partially superimposed, contiguous, mutually adhered sublayers 22a, 22b, etc., of spacers 22. As depicted in FIG. 7D, each spacer 22 includes two sublayers 22a, 22b, although stereolithographically fabricated spacers 22 having single layers or other numbers of sublayers are also within the scope of the present invention.

Figure 8:
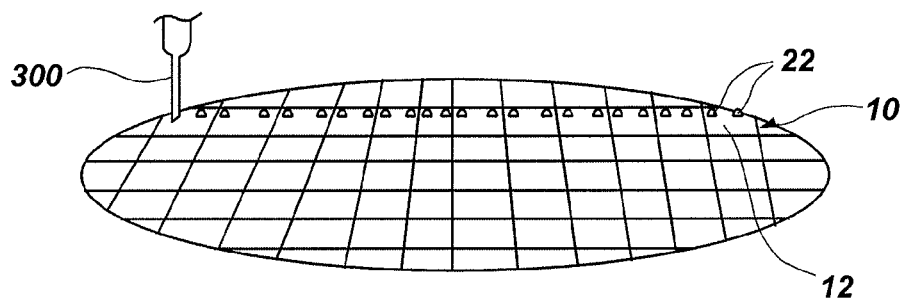
FIG. 8 schematically depicts the formation of spacers by way of a dispensing process.

As another alternative, illustrated in FIG. 8, spacers 22 may be formed by dispensing small, laterally discrete quantities of a spacer material, such as a polymer (e.g, an epoxy, thermoplastic polymer, etc.), directly onto an active surface 12 of a semiconductor device 10 that is singulated or part of a wafer, partial wafer, or other large-scale fabrication substrate. By way of example, such dispensing may be effected by way of an appropriately sized dispensing needle 300.

Of course, the process by which spacers 22 of spacer layers 20 are formed depends at least in part upon the particular materials used to form spacers 22.

Referring now to FIG. 9, an assembly 30 is depicted that includes a substrate 40, a first semiconductor device 10, and a second semiconductor device 110 stacked on first semiconductor device 10. Discrete conductive elements 18 electrically connect bond pads 16 of first semiconductor device 10 to corresponding contact areas 46 of substrate 40. Second semiconductor device 110 may overlie at least some bond pads 16 of first semiconductor device 10, as well as any discrete conductive elements 18 extending therefrom. First semiconductor device 10 and second semiconductor device 110 are separated from one another by way of spacers 22 located therebetween.

While substrate 40 is depicted as an interposer of which contact areas 46 are bond pads located on a top side 44 thereof, other types of substrates are also within the scope of the present invention, including, without limitation, circuit boards, other semiconductor devices, and leads.

In the illustrated example, back side 14 of first semiconductor device 10 is secured to substrate 40 by way of a suitable adhesive material 15, such as a thermoplastic resin, a silicon-filled thermoplastic resin, a thermoset resin, an epoxy, a silicone, a silcone-carbon resin, a polyimide, a polyurethane, or a parylene. Of course, first semiconductor device 10 may be secured to or otherwise associated with a substrate in a different manner, depending upon the particular type of substrate employed. By way of example only, leads may extend partially over and be secured to active surface 12 of first semiconductor device 10. Such leads may extend over corresponding bond pads 16 and be secured thereto directly (e.g., by thermocompression bonds) or by way of conductive joints (e.g., balls, bumps, pillars, columns, or other structures of a metal or metal alloy, such as solder, a conductive epoxy, a conductor-filled epoxy, or a z-axis conductive elastomer). Alternatively, discrete conductive elements, such as bond wires or TAB elements may be positioned or formed between each lead and its corresponding bond pad 16 to electrically connect the same.

The heights of spacers 22 may be greater than the distance discrete conductive elements 18 protrude above active surface 12 of first semiconductor device 10, thereby preventing discrete conductive elements 18 from electrically shorting on a back side 114 of the overlying second semiconductor device 110.

Alternatively, the heights of spacers 22 may be about the same as or even smaller than the distances discrete conductive elements 18 protrude above active surface 12, so long as the heights of spacers 22 and the combined strengths of discrete conductive elements 18 over which second semiconductor device 110 is positioned prevent discrete conductive elements 18 from being damaged (e.g., by being bent, kinked, or otherwise deformed) or from collapsing onto one another. If the heights of spacers 22 are less than the distance discrete conductive elements 18 protrude above active surface 12, it is preferred that portions of discrete conductive elements 18 and back side 114 that may contact one another be electrically isolated from each other. By way of example, at least portions of discrete conductive elements 18 may include a dielectric coating 19 thereon. Alternatively, or in addition, all or part of back side 114 may include a dielectric coating 116. Suitable dielectric materials for both dielectric coating 19 and dielectric coating 116 include, but are not limited to, nonconductive polymers, glass, silicon oxide, silicon nitride, and silicon oxynitride, as well as nonconductive oxides of the respective discrete conductive element 18 or second semiconductor device 110 material.

An adhesive material 115, such as a thermoset resin, a UV-curable material, a thermoplastic resin, a silicone, a silicone-carbon resin, a polyimide, a polyurethane, a parylene, or the like, may be located between active surface 12 of first semiconductor device 10 and back side 114 of second semiconductor device 110, securing first and second semiconductor devices 10 and 110 to one another.

Figure 9A:
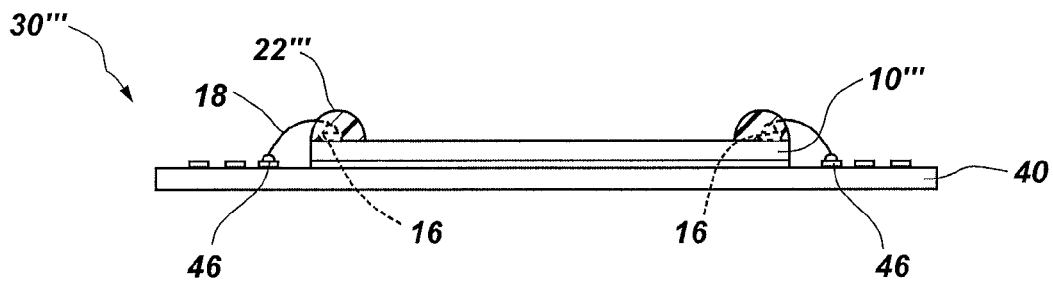
FIGS. 9A and 9B schematically represent an embodiment of semiconductor device to be used in a stacked assembly and that includes spacers formed over portions of discrete conductive elements that protrude over the active surface thereof.
Figure 9B:
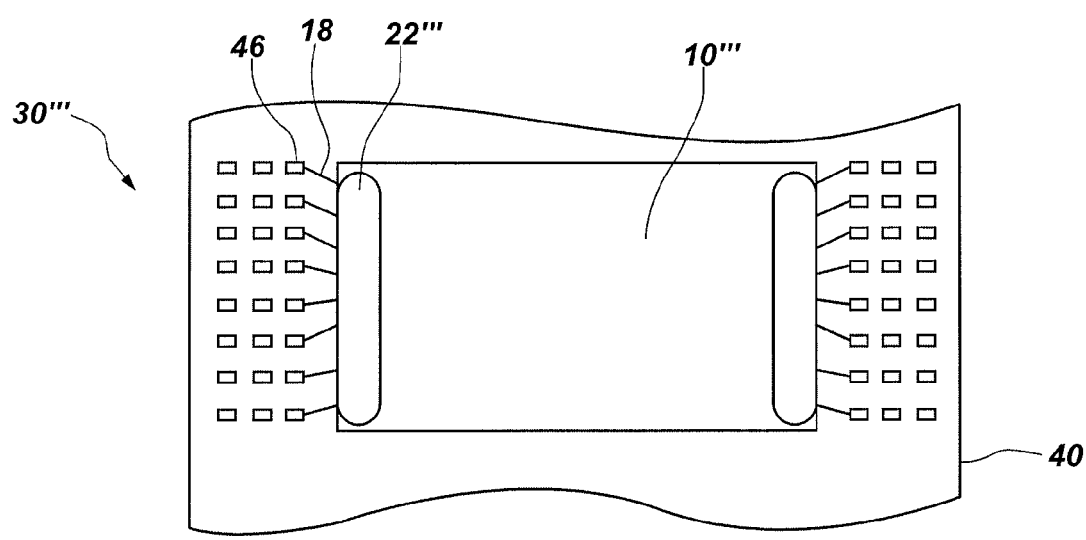
Figure 9:
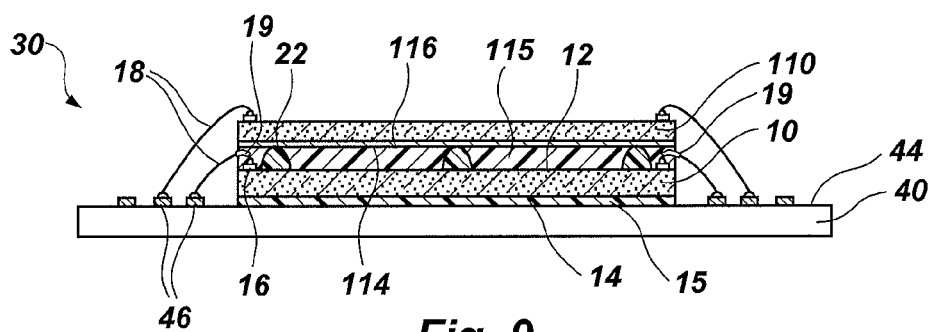
FIG. 9 is a cross-sectional representation of a stacked assembly that includes the semiconductor device of FIGS. 1 and 2.

In FIGS. 9A and 9B, a partial assembly 30''' is shown that includes a semiconductor device 10''' positioned over and secured to a substrate 40. Discrete conductive elements 18, such as bond wires, electrically connect bond pads 16 of semiconductor device 10''' to corresponding contact areas 46 of substrate 40. Spacers 22''' are formed over portions of discrete conductive elements 18 and may support and/or protect discrete conductive elements 18 as a second semiconductor device (not shown) is subsequently assembled thereover. While each spacer 22''' is depicted in FIG. 9B as an elongate member that encapsulates portions of a plurality of discrete conductive elements 18, other configurations of spacers that encapsulate discrete conductive elements 18 are also within the scope of the present invention, including, without limitation, smaller spacers that encapsulate portions of single discrete conductive elements 18.

Figure 9C:
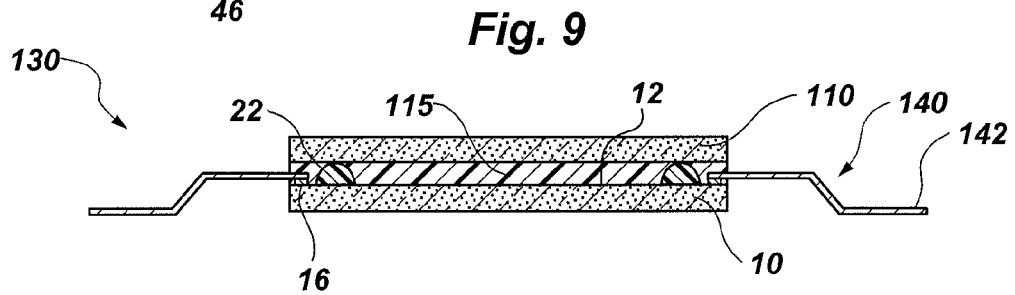
FIG. 9C is a cross-sectional representation of another embodiment of stacked semiconductor device assembly that includes the semiconductor device of FIGS. 1 and 2.

FIG. 9C depicts an assembly 130 that includes first and second semiconductor devices 10, 110, as well as spacers 22 and adhesive material 115 therebetween, that are similar to those of assembly 30 depicted in FIG. 9. Assembly 130 differs from assembly 30 in that substrate 140 comprises leads 142. As depicted, leads 142 are of a leads-over-chip (LOC) configuration and, thus, extend partially over and are secured to an active surface 12 of first semiconductor device 10. In addition, leads 142 are positioned at least partially over and bonded to corresponding bond pads 16 of first semiconductor device 10. By way of example only, leads 142 may be bonded to corresponding bond pads 16 by way of thermocompression bonds or by the use of a conductive adhesive material, such as solder, another metal or metal alloy, conductive or conductor-filled epoxy, an anisotropically conductive elastomer, or the like, between leads 142 and bond pads 16. Alternatively, LOC type leads 142 may communicate with corresponding bond pads 16 by way of discrete conductive elements (e.g., bond wires, TAB elements, etc.). Other variations of the assemblies depicted herein may include substrates that comprise other types of leads, circuit boards, an additional semiconductor device, or the like.

Figure 10:
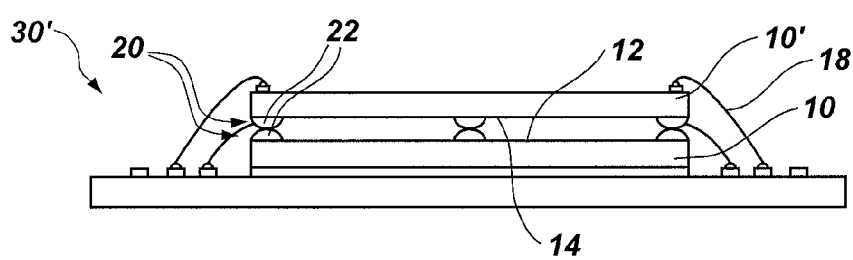
FIG. 10 is a side view of another stacked assembly, which includes a semiconductor device of the type shown in FIGS. 1 and 2 with a semiconductor device of the type illustrated in FIG. 3 stacked thereon.

In FIG. 10, another embodiment of assembly 30' includes a first semiconductor device 10 with a second semiconductor device 10' stacked thereon. As first semiconductor device 10 includes a spacer layer 20 on active surface 12 thereof and second semiconductor device 10' includes a spacer layer 20 on a back side 14' thereof (see also FIG. 3), spacer layers 20 are positioned adjacent to one another. At least some spacers 22 of the adjacent spacer layers 20 abut each other, with the combined heights of abutting spacers 22 defining the distance between first semiconductor device 10 and second semiconductor device 10'.

Figure 11:
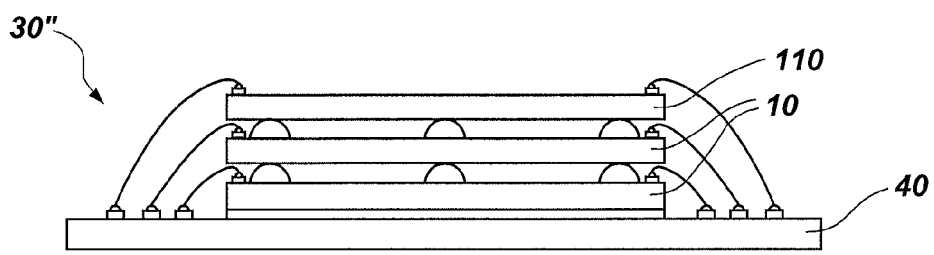
FIG. 11 is a side view of a stacked assembly including more than two semiconductor devices in stacked arrangement.

An assembly incorporating teachings of the present invention may include more than two semiconductor devices in stacked arrangement. FIG. 11 illustrates such an assembly 30'', which includes a substrate 40 and three semiconductor devices 10, 110 in stacked arrangement thereon.

Referring again to FIG. 9, an exemplary process for forming assembly 30 includes securing a first semiconductor device 10 to a substrate 40. As depicted, an adhesive material 15 is used, although other known methods for securing semiconductor devices to substrates are also within the scope of the present invention. Known processes may be used to form or position discrete conductive elements 18, such as TAB elements, thermocompression bonded leads, the depicted bond wires, or the like, between bond pads 16 of first semiconductor device 10 and corresponding contact areas 46 of substrate 40. Spacers 22 may be formed on regions of active surface 12 of semiconductor device 10 by known processes, such as those described previously herein with reference to FIGS. 5-8. The formation of spacers 22 may be effected before or after first semiconductor device 10 is secured to substrate 40, as well as before or after the formation of discrete conductive elements 18. A second semiconductor device 110 is positioned over spacers 22, with a back side 114 thereof resting against spacers 22.

Optionally, a suitable adhesive material 115, such as a known underfill material, may be introduced into voids 24 of spacer layer 20, between active surface 12 of first semiconductor device 10 and back side 114 of second semiconductor device 110. When spacers 22 at least partially encapsulate discrete conductive elements 18, as depicted in FIG. 10, spacers 22 may prevent discrete conductive elements 18 from being collapsed onto one another, bent, kinked, or otherwise distorted or damaged during the introduction of adhesive material 115 between first and second semiconductor devices 10 and 110. One or more known processes may be used to at least partially cure or otherwise harden adhesive material 115. Spacers 22 that at least partially encapsulate discrete conductive elements 18 may also electrically isolate discrete conductive elements 18 from the back side 114 of an adjacent semiconductor device 110.

Alternatively, a relatively high viscosity adhesive material 115 may be applied to a surface of one or both of first and second semiconductor devices 10 and 110 prior to assembly thereof with one another. Then, when first and second semiconductor devices 10 and 110 are assembled, adhesive material 115 fills voids 24 of spacer layer 20 and contacts opposed surfaces (e.g., active surface 12 and back side 114, respectively) of first semiconductor device 10 and second semiconductor device 110. Following the assembly of first semiconductor device 10 and second semiconductor device 110, one or more known processes may be used to at least partially cure or otherwise harden adhesive material 115.

Figure 12:
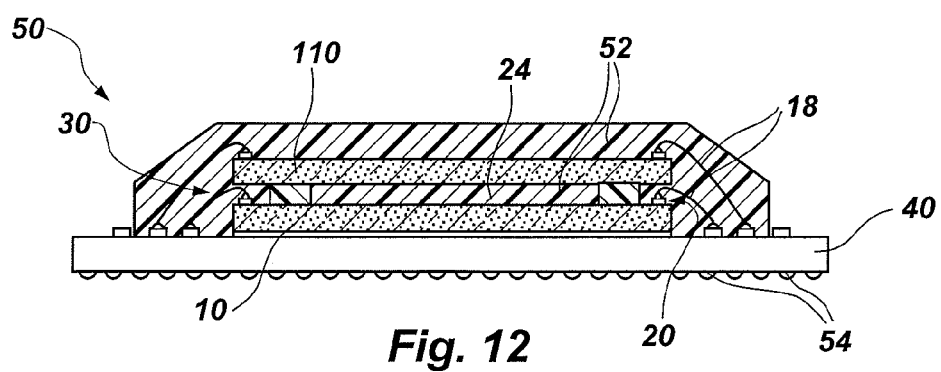
FIG. 12 is a cross-sectional representation of a package including an assembly of the present invention.

Turning now to FIG. 12, a package 50 incorporating teachings of the present invention may include any assembly (e.g., assemblies 30, 30', 30") according to the present invention. As illustrated, package 50 includes assembly 30, as well as an encapsulant 52 substantially filling voids 24 in spacer layer 20 and surrounding first and second semiconductor devices 10 and 110, discrete conductive elements 18, and portions of substrate 40 that are located adjacent to first semiconductor device 10. Alternatively, encapsulant 52 may be formed separately from a layer of adhesive material 115 (see, e.g., FIG. 9) between first semiconductor device 10 and second semiconductor device 110.

While encapsulant 52 is depicted as being formed by transfer molding processes or by pot molding processes and, thus, from appropriate compounds (e.g., a silicon-filled thermoplastic resin for transfer molding or an epoxy for pot molding), other encapsulation techniques, such as glob top processes, and appropriate materials may also be used to form encapsulant 52. Although encapsulant 52 may be formed separately from the layer of adhesive material 115 between first and second semiconductor devices 10 and 110, the same or similar materials may be used as adhesive material 115 and to form encapsulant 52. Likewise, adhesive material 115 and/or the material of encapsulant 52 may comprise the same or a similar material to that from which spacers 22 are formed. Use of the same or similar materials for these elements may optimize adhesion and provide for a matched coefficient of thermal expansion (CTE).

Package 50 may also include external connective elements 54 electrically coupled to corresponding contact areas 46 by vias and/or conductive traces (not shown) carried by substrate 40, as known in the art. External connective elements 54 may, by way of example only, comprise conductive plug-in type connectors, pin connectors, conductive or conductor-filled epoxy pillars, an anisotropically conductive adhesive, the depicted conductive bumps, or any other conductive structures that are suitable for interconnecting assembly 30 with other, external electronic components.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor device for use in a stacked multi-chip assembly, comprising:
    a semiconductor die; and
    a dielectric spacer layer secured to at least a portion of a surface of the semiconductor die and protruding from the surface to space the semiconductor die substantially a predetermined distance from an adjacent semiconductor die to accommodate a height of at least one intermediate conductive element that includes a bonding portion secured to a contact of the semiconductor die and a laterally extending portion located between and electrically isolated from an active surface of the semiconductor die and a back side of the adjacent semiconductor die, the dielectric spacer layer including voids communicating with a lateral periphery thereof.

2. The semiconductor device of claim 1, wherein the dielectric spacer layer comprises a plurality of laterally discrete spacers.

3. The semiconductor device of claim 1, further comprising:
    at least one discrete conductive element protruding above a surface of the semiconductor die.

4. The semiconductor device of claim 3, wherein the at least one discrete conductive element comprises one of a bond wire, a thermocompression bonded lead, and a tape-automated bond element.

5. The semiconductor device of claim 1, wherein the predetermined distance exceeds a distance a discrete conductive element protrudes above a surface of at least one of the semiconductor die and the adjacent semiconductor die.

6. The semiconductor device of claim 1, wherein the predetermined distance is about the same as or less than a distance a discrete conductive element protrudes above a surface of at least one of the semiconductor die and the adjacent semiconductor die.

7. The semiconductor device of claim 1, wherein the dielectric spacer layer covers only a portion of the surface.

8. The semiconductor device of claim 7, wherein the dielectric spacer layer comprises a pattern.

9. The semiconductor device of claim 7, wherein the dielectric spacer layer comprises randomly arranged features.

10. The semiconductor device of claim 1, wherein the dielectric spacer layer comprises a material that will adhere to a surface of the adjacent semiconductor die.

11. The semiconductor device of claim 1, wherein the dielectric spacer layer comprises a polymer.

12. The semiconductor device of claim 11, wherein the polymer comprises a photoimageable polymer.

13. The semiconductor device of claim 1, wherein the dielectric spacer layer comprises at least one of a glass, a silicon dioxide, a silicon nitride, and a silicon oxynitride.

14. The semiconductor device of claim 1, wherein the dielectric spacer layer is positioned on the active surface of the semiconductor die.

15. The semiconductor device of claim 1, wherein the dielectric spacer layer is positioned on a back side of the semiconductor die.

16. The semiconductor device of claim 1, further comprising:
    another dielectric spacer layer covering at least a portion of an opposite surface of the semiconductor die.

17. The semiconductor device of claim 1, further comprising:
    adhesive material on an exposed surface of the dielectric spacer layer.

18. The semiconductor device of claim 1, wherein the dielectric spacer layer comprises a plurality of at least partially superimposed, contiguous, adhered sublayers.

19. A semiconductor device assembly, comprising:
    a first semiconductor device including an active surface carrying bond pads that are configured to have intermediate conductive elements secured thereto;
    a nonconfluent spacer layer comprising dielectric material secured to the active surface of the first semiconductor device and, prior to securing an intermediate conductive element to any of the bond pads, protruding from the active surface substantially a same distance the active surface of the first semiconductor device is to be spaced apart from a back side of a second semiconductor device; and the second semiconductor device, including a back side secured to the nonconfluent spacer layer.

20. The semiconductor device assembly of claim 19, wherein the nonconfluent spacer layer comprises at least one void therein that communicates with a lateral periphery of the nonconfluent spacer layer.

21. The semiconductor device assembly of claim 20, wherein the at least one void facilitates lateral introduction of adhesive material between the first and second semiconductor devices.

22. The semiconductor device assembly of claim 19, wherein the nonconfluent spacer layer comprises a plurality of laterally discrete spacers.

23. The semiconductor device assembly of claim 19, wherein the nonconfluent spacer layer has a substantially uniform thickness.

24. The semiconductor device assembly of claim 19, further comprising:

at least one intermediate conductive element protruding above the active surface of the first semiconductor device and located at least partially between the first and second semiconductor devices.

25. The semiconductor device assembly of claim 24, wherein the nonconfluent spacer layer has a thickness that spaces the first and second semiconductor devices apart from one another a distance that exceeds a height the at least one intermediate conductive element protrudes above the active surface of the first semiconductor device.

26. The semiconductor device assembly of claim 24, wherein the nonconfluent spacer layer has a thickness that spaces the first and second semiconductor devices apart from one another a distance that is about the same as or less than a height the at least one discrete conductive element protrudes above the active surface of the first semiconductor device.

27. The semiconductor device assembly of claim 19, wherein the nonconfluent spacer layer comprises dielectric material.

28. The semiconductor device assembly of claim 19, wherein the nonconfluent spacer layer comprises a polymer.

29. The semiconductor device assembly of claim 28, wherein the polymer adheres to surfaces of the first semiconductor device and the second semiconductor device.

30. The semiconductor device assembly of claim 28, wherein the polymer comprises a photoimageable polymer.

31. The semiconductor device assembly of claim 19, wherein the nonconfluent spacer layer comprises a plurality of at least partially superimposed, contiguous, mutually adhered sublayers.

32. The semiconductor device assembly of claim 19, wherein the nonconfluent spacer layer comprises at least one of a glass, a silicon oxide, a silicon nitride, and a silicon oxynitride.

33. The semiconductor device assembly of claim 19, wherein the nonconfluent spacer layer comprises a pattern.

34. The semiconductor device assembly of claim 19, wherein the nonconfluent spacer layer comprises randomly arranged features.

35. The semiconductor device assembly of claim 19, further comprising:

an adhesive material securing the nonconfluent spacer layer to at least one of the active surface of the first semiconductor device and the active surface of the second semiconductor device.

36. The semiconductor device assembly of claim 35, wherein the adhesive material is located within voids in the nonconfluent spacer layer.

37. The semiconductor device assembly of claim 19, further comprising:

a substrate upon which the first semiconductor device is positioned.

38. The semiconductor device assembly of claim 37, wherein at least one bond pad of at least one of the first semiconductor device and the second semiconductor device is in communication with a corresponding contact area of the substrate.

39. The semiconductor device assembly of claim 37, wherein the substrate comprises at least one of a circuit board, an interposer, another semiconductor device, and leads.

40. The semiconductor device assembly of claim 19, further comprising:

at least one additional semiconductor device.

41. semiconductor device assembly of claim 19, wherein the nonconfluent spacer layer comprises a plurality of layers, additive thicknesses of the plurality of layers defining substantially the same distance.

42. The semiconductor device assembly of claim 41, wherein a first layer of the plurality of layers is secured to the active surface of the first semiconductor device and a second layer of the plurality of layers is configured to be secured to the back side of the second semiconductor device.

43. The semiconductor device assembly of claim 41, wherein at least some solid regions of each of the plurality of layers are at least partially superimposed relative to one another.

* * * * *

UNITED STATES PATENT AND TRADEMARK OFFICE
CERTIFICATE OF CORRECTION

| | | |
|---|---|---|
| PATENT NO. | : 7,518,223 B2 | Page 1 of 1 |
| APPLICATION NO. | : 09/939253 | |
| DATED | : April 14, 2009 | |
| INVENTOR(S) | : Derderian | |

It is certified that error appears in the above-identified patent and that said Letters Patent is hereby corrected as shown below:

In column 14, line 36, in Claim 41, before "semiconductor" insert -- The --.

Signed and Sealed this

Fourteenth Day of July, 2009

JOHN DOLL
*Acting Director of the United States Patent and Trademark Office*